(12) United States Patent
Tanabe (10) Patent No.: US 7,504,826 B2
(45) Date of Patent: Mar. 17, 2009

(54) SUPERCONDUCTING MAGNET AND MRI APPARATUS USING THE SAME

(75) Inventor: Hajime Tanabe, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 111 days.

(21) Appl. No.: 11/703,740

(22) Filed: Feb. 8, 2007

(65) Prior Publication Data

US 2008/0030193 A1 Feb. 7, 2008

(30) Foreign Application Priority Data

Jul. 31, 2006 (JP) ............................ 2006-208023

(51) Int. Cl.
*G01V 3/00* (2006.01)
(52) U.S. Cl. .................. 324/319; 324/320; 335/216
(58) Field of Classification Search ................ 324/319, 324/318; 335/216
See application file for complete search history.

(56) References Cited

U.S. PATENT DOCUMENTS

| | | | |
|---|---|---|---|
| 5,278,503 A * | 1/1994 | Keller et al. ................ 324/318 |
| 5,329,266 A | 7/1994 | Soeldner et al. |
| 5,731,939 A * | 3/1998 | Gross et al. ................... 361/19 |
| 6,960,914 B2 * | 11/2005 | Shen et al. .................. 324/319 |
| 6,977,571 B1 * | 12/2005 | Hollis et al. ................ 335/216 |
| 7,330,341 B2 * | 2/2008 | Frantz ......................... 361/19 |
| 7,400,223 B2 * | 7/2008 | Spreiter et al. ............. 335/216 |

FOREIGN PATENT DOCUMENTS

| JP | 04-287903 A | 10/1992 |
|---|---|---|
| JP | 09-260130 A | 10/1997 |

* cited by examiner

*Primary Examiner*—Louis M Arana
(74) *Attorney, Agent, or Firm*—Buchanan Ingersoll & Rooney PC

(57) ABSTRACT

A superconducting magnet of the present invention includes a switching element that closes its output side (operation side) when the voltage on its input side is smaller than a predetermined value and opens the output side when the voltage on the input side is larger than the predetermined value, wherein the input side is connected in parallel to a main coil circuit, and the output side of is connected in series to external magnetic-field disturbance compensation coils, for releasing the circuit of the disturbance compensation coil by closing the output side if the voltage on the input side is smaller than the predetermined value.

8 Claims, 8 Drawing Sheets

SUPERCONDUCTING MAGNET AND MRI APPARATUS USING THE SAME

BACKGROUND OF THE INVENTION

1. Field of the Invention

The present invention relates to superconducting magnets provided with an external magnetic-field disturbance compensation coil for compensating external magnetic-field disturbances that cause adverse effects on magnetic resonance imaging for medical use (hereinafter referred to as MRI) employing a magnetic resonance phenomenon occurring in a static magnetic field, and also relates to MRI apparatus using the superconducting magnets.

2. Description of the Prior Art

Several kinds of magnets such as a permanent magnet, a normal conducting magnet, and a superconducting magnet are generally given as a source for a static magnetic field necessary for an MRI apparatus. Among them, a superconducting magnet has been the mainstream of the source due to advantages of major requirements for MRI apparatus such as magnitude and temporal stability of the static magnet field.

However, since a superconducting magnet produces a strong static magnetic field, it is necessary to prevent the magnetic field from leaking out. For the prevention, two methods are mainly employed, by which the magnets, the source of the static magnetic field, are roughly classified into two types.

One of the methods is that a superconducting magnet body is enclosed by a ferrous material that shields the magnet body from the outside thereof (passive shield method). The other is that superconducting main coils of polarities opposite to each other are arranged in pairs, so as to cancel the influence of the produced magnetic field, on its outside (active shield method). Out of the two, a magnet employing the active shield method has been the mainstream due to its lightweight and compactness.

In the meantime, an MRI apparatus is installed at various palaces and in various environments; it is installed next to a road in some cases or close to power cables for power transmission or electric trains in other cases. Under these circumstances, due to approaching of a large ferrous mass or an influence of an alternating magnetic field, magnetic-field fluctuation of non-negligible strength (hereinafter referred to as external magnetic-field disturbance) penetrates from the outside into the imaging space in the static magnetic field while images are being taken. In a case of a superconducting magnet employing the passive shield method, external magnetic-field disturbances often raise no significant problem due to the self-shield effect of the ferrous material. In the case of a superconducting magnet employing the active shield method, however, if the magnet remains intact without taking any measures, most of the external magnetic-field disturbances penetrate into the imaging space, which raises a possibility to exert a considerably adverse effect on the imaging.

Hence, in order to suppress influences of external magnetic-field disturbances, there has been a technique in which a superconducting coil, which is referred to as an external magnetic-field disturbance compensation coil, is arranged independently of the main coils, for exclusively compensating the external magnetic-field disturbances. This is due to the fact that a current is induced in the external magnetic-field disturbance compensation coil to generate a compensating magnetic field when the external magnetic-field disturbances penetrate thereinto. By the compensation with the external magnetic-field disturbance compensation coil and by compensation with the main coil, whose effect is relatively small, magnetic-field fluctuation in the imaging space is suppressed less than a few percent of the amount of the penetrated external magnetic-field disturbances.

Meanwhile, the main coil is a superconducting coil through which a large current passes in a persistent current mode under normal conditions. When a breakage phenomenon of the superconducting state, which is referred to as a quench, occurs for some reason, a large amount of energy is released at a burst. Although most of the energy is released as heat, if the main coil and the external magnetic-field disturbance compensation coil are coupled magnetically with each other, some of the energy is transferred to the external magnetic-field disturbance compensation coil by electromagnetic induction.

At this moment, a current is induced in the external magnetic-field disturbance compensation coil in proportion to the degree of the magnetic coupling. Since the magnetic field generated by the main coil, however, may sometimes not sufficiently decay yet by that moment, the external magnetic-field disturbance compensation coil is subject to extremely large electromagnetic force in many cases. The reason why is that since the external magnetic-field disturbance compensation coil usually has a smaller number of turns than that of the main coil due to such constraints as costs and its installation space, a current larger than that in the main coil (400 to 700 A, for example) might be induced in the external magnetic-field disturbance compensation coil as the case may be.

Moreover, since the overall volume of an external magnetic-field disturbance compensation coil, which is cylindrically wound up, is small due to its small number of turns, a large internal stress is generated in the coil by electromagnetic force. Therefore, it has been difficult to provide sufficient strength for the coil to withstand the electromagnetic force.

For this reason, the external magnetic-field disturbance coil needs to be devised to induce as a low current as possible. For example, a countermeasure is needed in which a current flow would be limited under several dozen amperes. However, since the external magnetic-field disturbance coil is usually made of a superconducting wire, even though using a superconducting wire of low performance, a current of several dozen amperes is likely to pass through the coil. In addition, the reason why the external magnetic-field disturbance coil is made of a superconducting wire is that external magnetic-field disturbances could occur in a situation where a ferrous mass approaches the coil and stays intact there. In such situation, if an external magnetic-field disturbance coil is made of a normal conducting wire such as a copper wire, an induced current immediately decays, which may sometimes not be able to compensate the disturbances for a long time. Therefore, the external magnetic-field disturbance coil should be designed taking such a decay time constant into account.

There has been a configuration that copes with such problems as described above. On detecting a coil quench based upon abnormal voltage on an abnormal voltage detection tap provided on a superconducting coil, a persistent current switch connected in parallel to the superconducting coil is opened to detect an excess voltage via feed lines of the superconducting coil, connected to an excitation power supply. If the voltage exceeds a predetermined value, a circuit breaker works to cut off the current fed from the power supply to the superconducting coil (refer to, for example, Japanese Patent Laid-Open No. 09-260130, paragraphs 0015 through 0019 and FIG. 1 (Patent Document 1)).

There has been another configuration that provides in an external magnetic-field disturbance coil a portion in which a quench occurs at lower current. Even if a large current is induced in the external magnetic-field disturbance coil by a quench in the main coil, the induced current cannot flow any longer due to the quench at the portion (refer to, for example, Japanese Patent Laid-Open No. 04-287903, paragraphs 0049 through 0050 and FIG. 3 (Patent Document 2)).

In order to cut off a power supply current by detecting a quench with a configuration as disclosed in Patent Document 1, it has needed to provide circuits for detecting the quench and shutting off the power, which involves a requirement of a complicated control configuration. Moreover, since an induced current passing through the external magnetic-field disturbance coil is not directly cut off, there has been a problem with response as well.

On the other hand, in a configuration as disclosed in Patent Document 2, there has also been a problem with response, because after a current has been induced in the external magnetic-field disturbance coil by a quench in the main coil, the induced current is not cut off immediately by detecting the quench in the main coil itself, but cut off by quenching the portion of the external magnetic-field disturbance coil by the induced current. In order to provide the portion that is quenched at low current, in part of the external magnetic-field disturbance coil, there is a method of providing a portion that is composed of, for example, one or a few fine (tens μm to hundreds μm) superconducting filaments. Since such filaments, however, have a small heat capacity, malfunctions caused by melting of the filaments are likely to occur due to Joule heat generated after quenching in the filament portion. Moreover, since the filaments are fine, there has been an instability in which the filaments easily break off due to factors other than heat.

SUMMARY OF THE INVENTION

The present invention has been made to solve the above-described problems, and to realize a protection that ensures safety for the external magnetic-field disturbance coil and hardly causes malfunctions without providing a complicated circuit even when a quench occurs in the main coil.

A superconducting magnet of the present invention includes a switching element that closes its output side (operation side) when the voltage on its input side is smaller than a predetermined value and open the output side when the voltage on the input side is larger than the predetermined value, wherein the input side is connected in parallel to a main coil circuit, and the output side is connected in series to an external magnetic-field disturbance compensation coil, so that the circuit of the external magnetic-field disturbance compensation coil is released by opening the output side if the voltage on the input side is larger than the predetermined value.

DESCRIPTION OF THE PREFERRED EMBODIMENT

Embodiment 1

Figure 1:
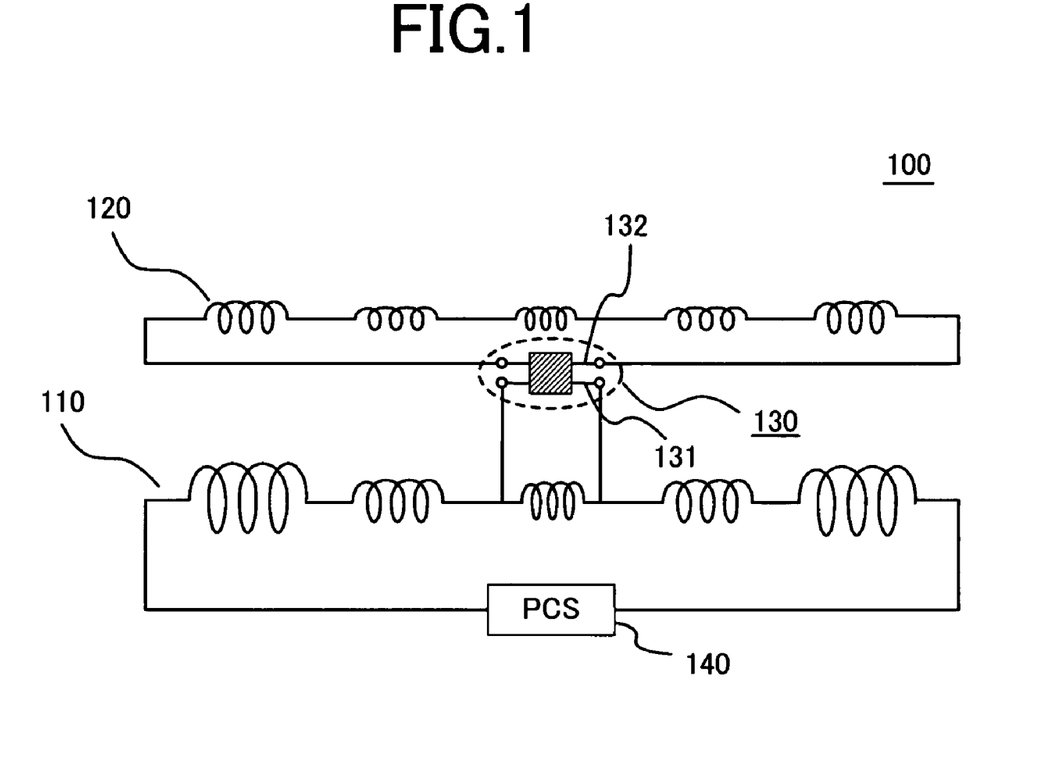
FIG. 1 is a schematic circuit diagram of a superconducting magnet according to Embodiment 1 of the present invention.

FIG. 1 is a schematic circuit diagram of a superconducting magnet 100, employed in MRI apparatus, according to Embodiment 1 of the present invention. Main coils 110 for generating a static magnetic field and external magnetic-field disturbance compensation coils 120 for suppressing external magnetic-field disturbances are configured to form each electric circuit, and these circuits electrically cooperate with each other via a switching element 130.

The main coils 110 are superconducting coils and remains in a superconducting state under normal conditions, so that a persistent current is passed therethrough so as to generate a strong and stable static magnetic field. The main coils 110 are provided with a persistent current switch 140 (hereinafter referred to as PCS). In addition, the main coils are practically arranged with their own inverse polarity coils being mixed, which is not illustrated in FIG. 1 for simplicity, in order to configure an active shield so as to prevent the magnetic field from leaking outside the MRI apparatus.

The external magnetic-field disturbance compensation coils 120 generally have the number of turns smaller than that of the main coils 110 and are usually wound with the identical polarity to the main coils 110. Moreover, the external magnetic-field disturbance compensation coils 120 generally couple with the main coils 110 magnetically to some extent.

The switching element 130 is a relay to switch the opening and closing of its output side 132 (operation side) in response to variation of a current passing through its input side 131. The input side 131 is connected in parallel to the main coils 110 and the output side 132 is connected in series to the external magnetic-field disturbance compensation coils 120.

A semiconductor relay such as referred to as Optical-MOS FET, or Photo-MOS relay can be employed as the switching element 130, which is configured such that its output side 132 is opened to cut off a current passing there though when a current larger than a predetermined value passes through its input side 131. A mechanical relay can also be used that opens and closes its output side 132 by use of electromagnetic force generated when an inputted current is passed through its input side 131. Mechanical relays, compared to semiconductor relays, generally have shortcomings such as a large operating current, a slow operation, and a short usable life (although its operation cycles are several hundred thousands yet) on the one hand, and have an advantage of some small resistance of the output side 132 when being closed (hereinafter referred to as ON-resistance) on the other hand.

In addition, the input side 131 of the switching element 130 is connected in parallel to both ends of not the whole of the main coils 110 but part of them, and it is selectively connected to a position where some voltage is produced across the ends when a quench occurs in the main coils 110.

Figure 2:
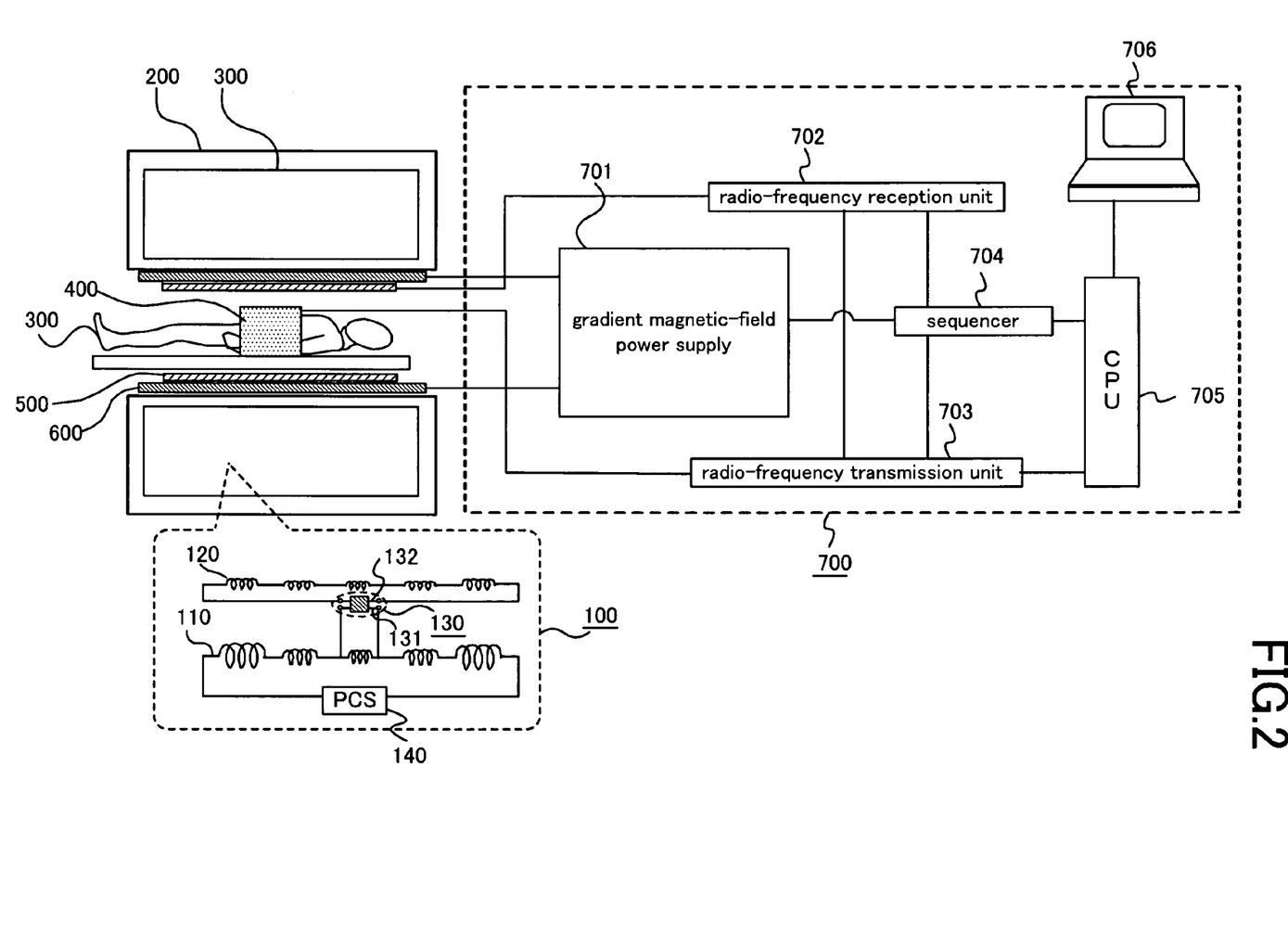
FIG. 2 is a conceptual view illustrating a configuration of MRI apparatus using the superconducting magnet according to Embodiment 1 of the invention.

FIG. 2 is a conceptual view showing major components of the MRI apparatus using the superconducting magnet shown in FIG. 1. The superconducting magnet 100 is accommodated within a refrigerating container 300 in a vacuum insulating container 200. Generally, a radio-frequency reception coil 400, a radio-frequency transmission coil 500, and a gradient magnetic-field coil 600 are disposed around an examining patient lying in the imaging space in the static magnetic field generated by the superconducting magnet 100, and these coils are controlled by a controller 700. The controller 700 is composed of several units such as a gradient magnetic-field power supply unit 701, a radio-frequency transmission unit 702, a radio-frequency reception unit 703, a sequencer unit 704, a central processing unit 505, and a monitor 706.

Figure 3:
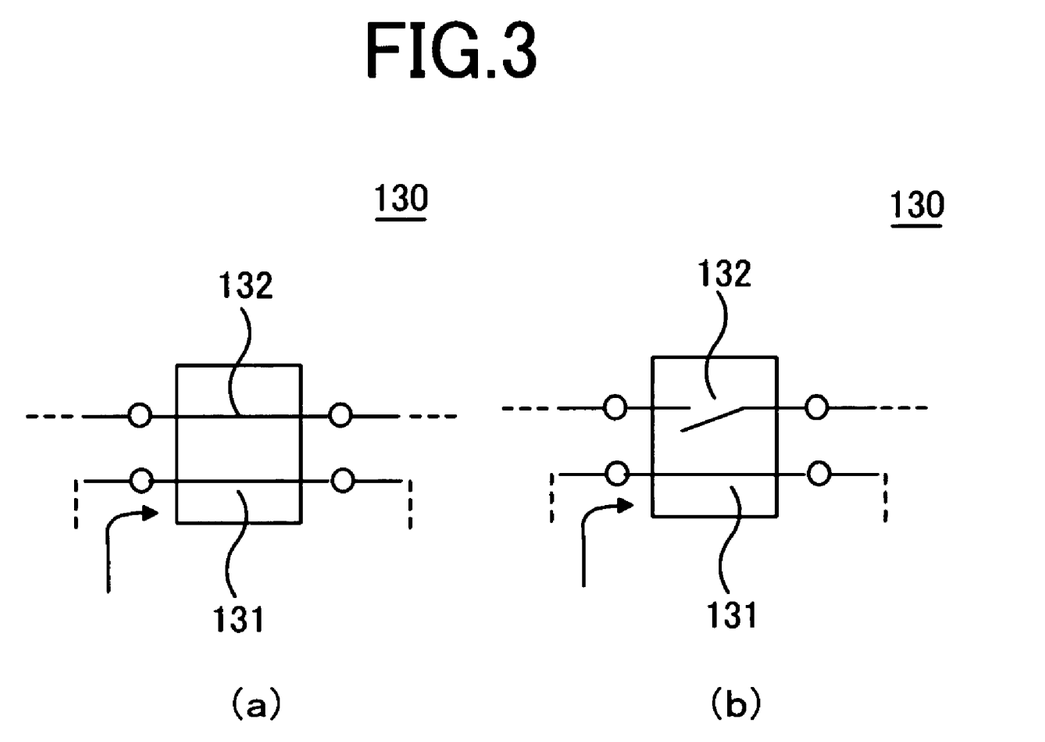
FIG. 3A and FIG. 3B are explanatory views each showing the operation of a switching element according to Embodiment 1 of the invention.

Next, an operation will be explained. FIGS. 3A and 3B are conceptual views illustrating the operation of the switching element 130: FIG. 3A and FIG. 3B show a state before the operation and a state after the operation, respectively. In FIG. 3A, no current passes through the input side 131, that is, the output side 132 is in the closed state at this moment. Then, when a current passes through the input side 131, the output side 132 comes into the open state at the moment as shown in FIG. 3B.

Under normal conditions, the main coils 110 remain in a superconducting state, so that almost no voltage is produced across both ends of the input side 131 of the switching element 130, which is the state shown in FIG. 3A. When a quench occurs in the main coils 110, some voltage is produced across both ends of the input side 131, so that a current passes therethrough, which results in the output side 132 being opened to the state shown in FIG. 3B. Thereby, since the entire circuit of the external magnetic-field disturbance compensation coils 120 comes into the open state when the main coils 110 are quenched, a current is no longer induced at all by the quench of the main coils 110. Moreover, the current decays instantaneously that has been induced during a short time till the circuit of the disturbance compensation coils 120 becomes open.

As described above, if the main coils 110 are quenched, the circuit of the external magnetic-field disturbance compensation coils 120 can be opened by the switching element 130 operated with variation of voltage, as a direct input thereto, that is produced in the main coils 110 by the quench. Thereby, the disturbance compensation coils 120, magnetically coupled to the main coils 110, can be protected from a quench in the main coils 110 without providing a special control system that detects the quench in the main coils 110 and controls the circuit of the disturbance compensation coils 120.

Moreover, since the circuit of the external magnetic-field disturbance compensation coils 120 itself can be opened, such a problem as a large heat load exerts on part of the disturbance compensation coils 120 is eliminated.

Furthermore, since the switching element 130 operates even under a large magnetic coupling between the main coils 110 and the external magnetic-field disturbance compensation coils 120, there is no need to reduce the magnetic coupling, which eliminates particular constraints to the configuration of the disturbance compensation coils 120. Furthermore, a spool frame around which both the main coils 110 and the disturbance compensation coils 120 are wound can be shared between them, allowing the frame to be structurally simplified.

Furthermore, since the circuit of the external magnetic-field disturbance compensation coils 120 is released in a short time when a quench occurred in the main coils 110, a large current is not induced in the main coils 110 by electromagnetic induction, which causes no malfunctions.

A current of less than one ampere is usually induced in the disturbance compensation coils 120 during compensating external magnetic-field disturbances. Since a large current cannot be induced when a quench occurs in the main coils 110, the disturbance compensation coils 120 does not need to be firmly constructed to withstand large electromagnetic force.

Therefore, increase of the number of turns of the disturbance compensation coils 120 is unnecessary for reducing a current induced by the main coils 110. That is, the number of turns of the external magnetic-field disturbance compensation coils 120 can be reduced to the utmost, which saves the usage of superconducting wire.

Figure 4:
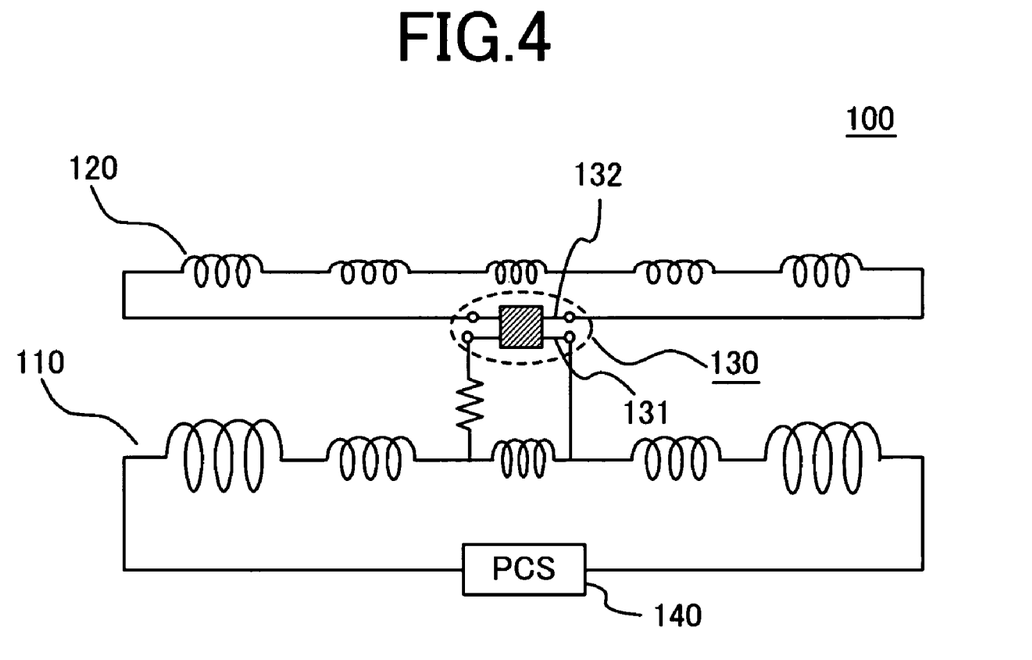
FIG. 4 is a modified schematic circuit diagram of the superconducting magnet according to Embodiment 1 of the invention.

In the above explanation, voltage variation produced at part of the main coils 110 is directly inputted to the input side 131 of the switching element 130. Since the switching element 130, in general, often has a predetermined range of its operating current, it is necessary to extract a right voltage for the range, from those produced at any part of main coils 110. Hence, a current inputted into the switching element 130 is adjusted by providing an appropriate resistor in the circuit of the input side of the switching element 130 as shown in FIG. 4. The resistor provided is necessarily chosen so as not to cause the switching element 130 to malfunction even in a case of the maximum voltage among those produced under various quenching conditions in the main coils 110.

As described before, the external magnetic-field disturbance compensation coils 120 are configured with superconducting coils so that a magnetic field induced by the disturbance compensation coils 120 does not decay to a certain extent of time. On the other hand, ON-resistance of the output side 132 of the switching element 130 connected in series to the disturbance compensation coils 120 affects a decay time constant to become short, which denotes a decay rate of the magnetic field induced by the disturbance compensation coils 120.

Figure 5:
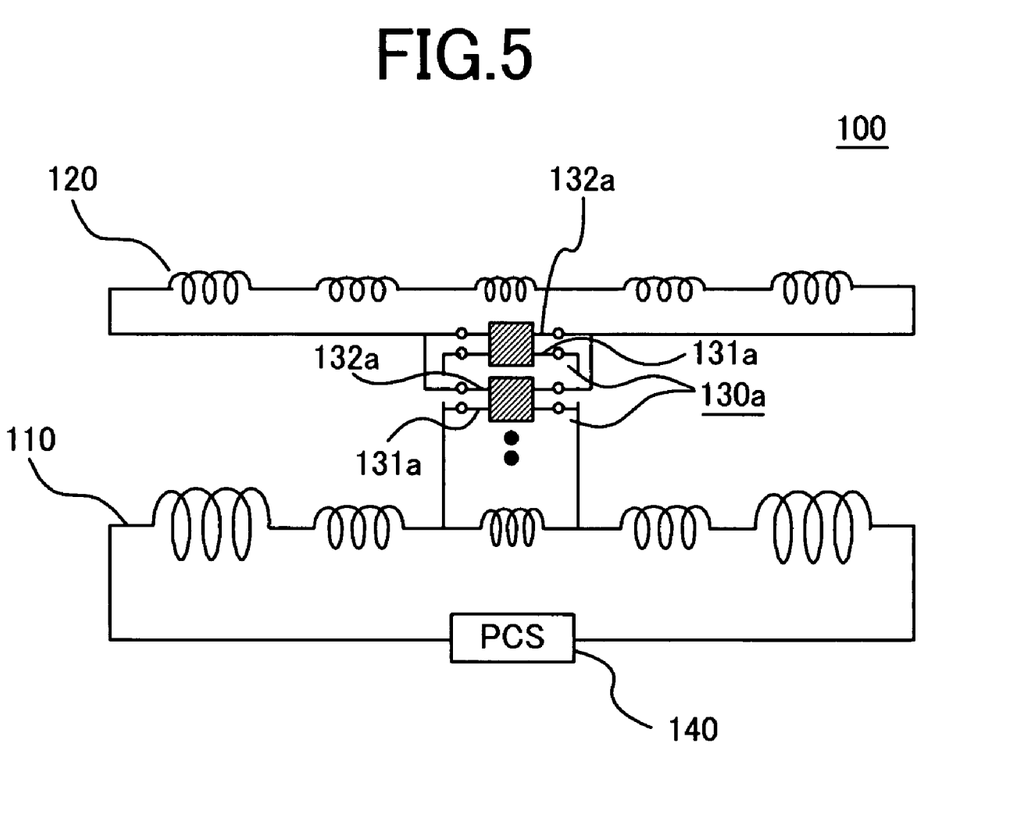
FIG. 5 is another modified schematic circuit diagram of the superconducting magnet according to Embodiment 1 of the invention.

When ON-resistance of the switching element 130 has a problematically large value, while there is no problem with a sufficiently small value, a measure may be taken in which a plurality of such switching elements 130a, each of which is identical to the switching element 130, is connected in parallel with each other as shown in FIG. 5 in order to reduce resistance of the circuit of the external magnetic-field disturbance compensation coils 120. Thereby, the overall resistance between both ends of the plurality of switching elements 130a connected in parallel decreases inversely proportional to the number of switching elements 130a. As a result, a decay time constant becomes large in proportion to the number of switching elements 130a.

The switching element 130 basically operates with a predetermined current caused by voltage produced by a quench in main coils 110, passing through the input side 131. While FIG. 5 indicates that the main coils 110 sides of the switching elements 130a are connected in parallel, the switching elements 130a can also operate when they are connected in series. The parallel connection, however, has an advantage in which the switching elements 130a operate quickly because a current passed through each of the input sides 131a is larger in parallel connection than in series connection if the same voltage is produced.

When a large number of switching elements 130a are required, however, in order to obtain a desired decay time constant, four wirings necessary for each of the switching elements 130a make their handling complicated and the total wirings extending to a large number tends to cause malfunctions in manufacturing as well.

Figure 6:
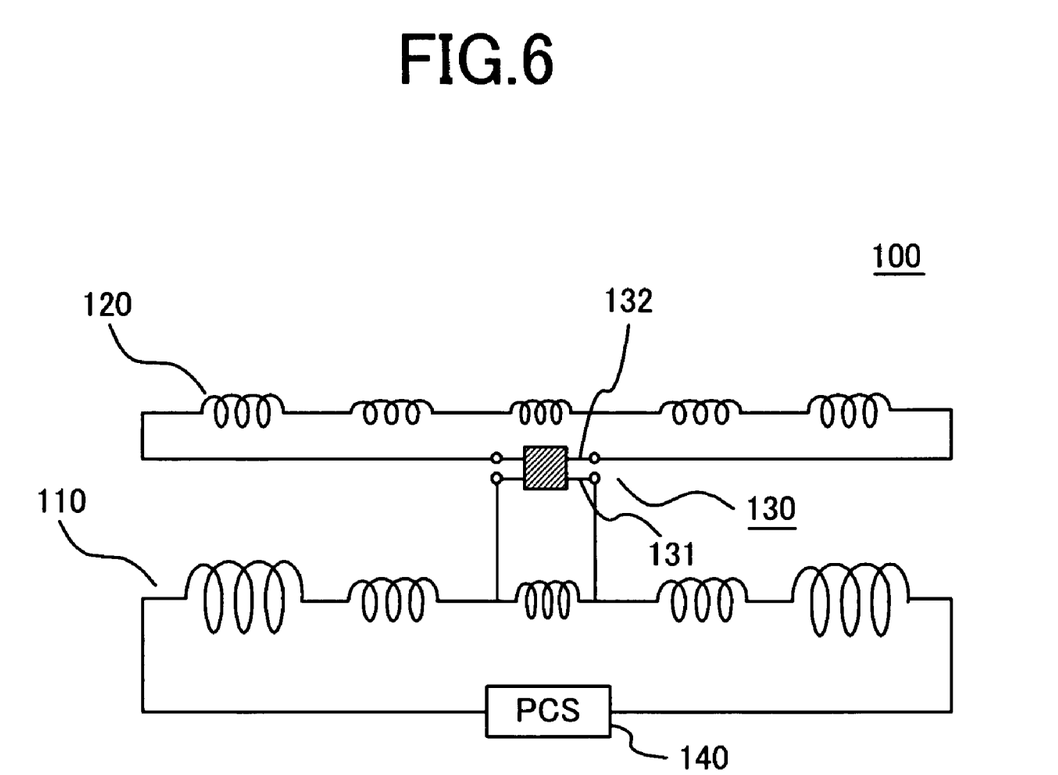
FIG. 6 is another modified schematic circuit diagram of the superconducting magnet according to Embodiment 1 of the invention.

In such case, it is effective to take a measure that increases the number of turns of the external magnetic-field disturbance compensation coils 120 as shown in FIG. 6. If the number of turns of each of the disturbance compensation coils 120 is increased two times, its self-inductance becomes four times. It follows that a decay time constant becomes four times if the resistance between both ends of the switching elements 130a remains unchanged. That is, the same effect is brought about as that of four switching elements 130a connected in parallel.

In addition, using thin wires for the external magnetic-field disturbance compensation coils 120 may cope with increase of the number of turns in order to prevent costs and its installation space from increasing.

Employing a mechanical relay as the switching element 130 has an advantage of lower ON-resistance (also referred to as contact resistance) compared with semiconductor relays as described before. This is favorable to a decay time constant. In a case of using a mechanical relay, in particular, further devising its material, form, size, and the like of the output side 132, would make it possible to drastically reduce ON-resistance. That is, measures can be taken that increase the decay time constant without connecting the plurality of switching elements 130a in parallel nor increasing the number of turns of the external magnetic-field disturbance compensation coils 120.

Figure 7:
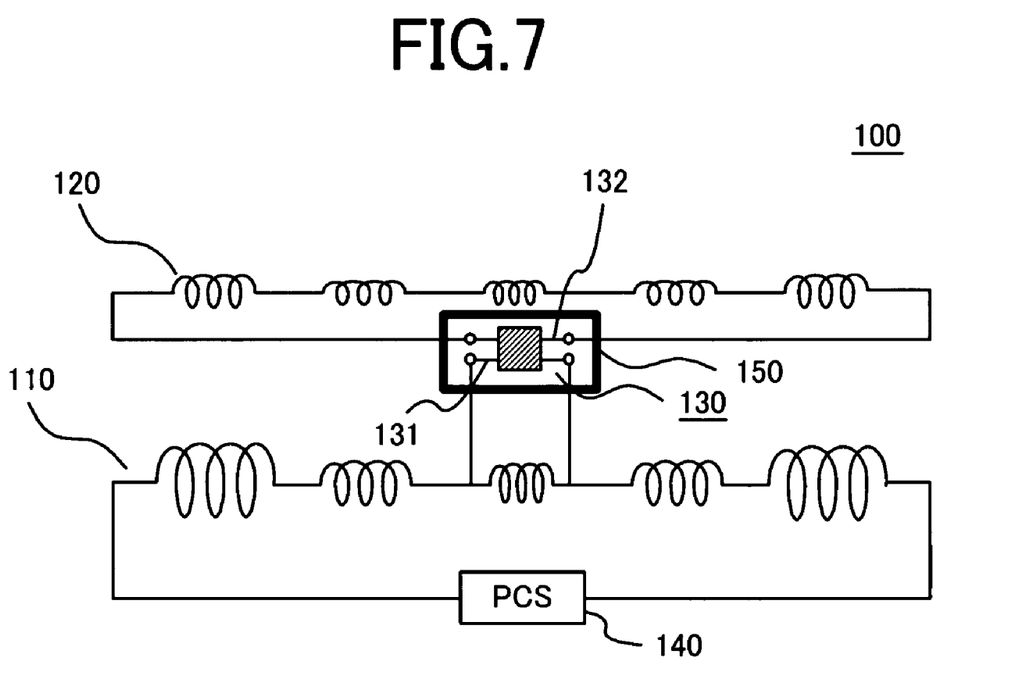
FIG. 7 is a view illustrating a modified configuration of the superconducting magnet according to Embodiment 1 of the invention.

Since a mechanical relay, however, operates by use of electromagnetic force, malfunctions may occur when it is placed inside such devices continuously generating a strong static magnetic field as a magnet of an MRI apparatus. Hence, the switching element 130 is desirably disposed at a position where magnetic-field strength is as low as possible, that is, the element may be disposed, for example, as axially close to the center of a superconducting magnet 100 and as radially outward from the center axis of the magnet as possible. Moreover, the switching element 130 of a mechanical relay may be enclosed by a shield member 150 made of a ferromagnetic material such as a ferrous material as shown in FIG. 7 so as not to be subject to the static magnetic field. With a sufficient shield, worries about the malfunctions can be eliminated.

In addition, it goes without saying that the above described method is not limited to a mechanical relay but can be applied to a semiconductor relay whose switching element 130 has characteristics in which its operation is hindered by influences of environmental magnetic fields.

The foregoing explanations are limited to measures against a quench that occurs only in the main coils 110. Actually, a current is induced in the external magnetic-field disturbance compensation coils 120 even while exciting or degaussing (also referred to as demagnetizing) the main coils 110. Therefore, the circuit of the disturbance compensation coils 120 is also desirable to be opened during such period.

However, since such steep variation in voltage as that by a quench does not occur during the exciting or degaussing, a current sufficient for the switching element 130 to operate, that is, to open the output side 132, may not pass through the input side 131.

Figure 8:
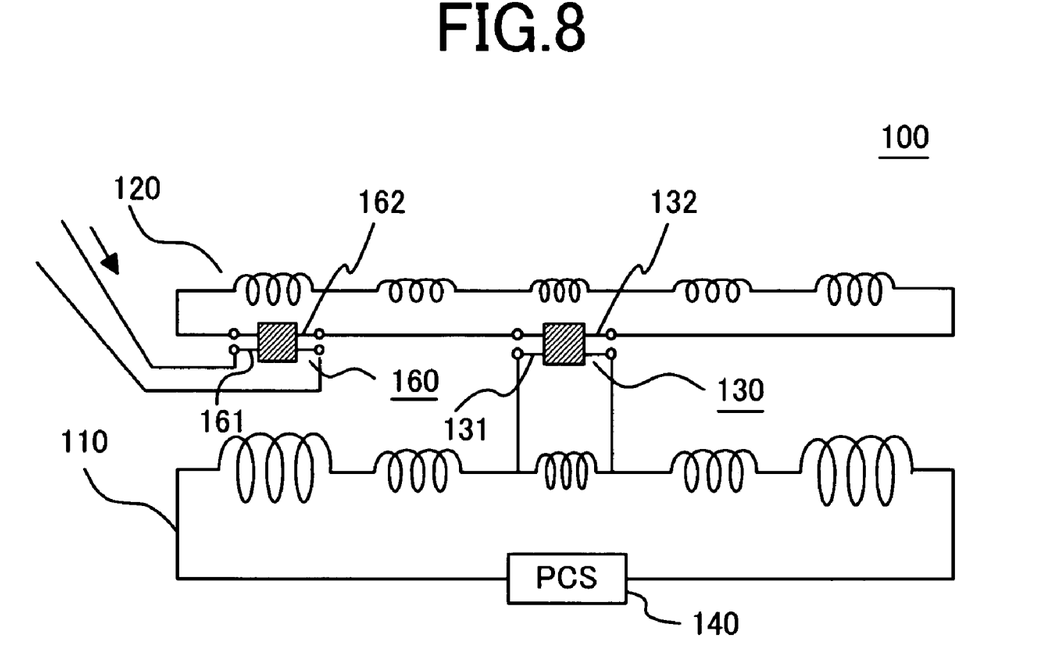
FIG. 8 is a view illustrating another modified configuration of the superconducting magnet according to Embodiment 1 of the invention.

Hence, as shown in FIG. 8, another switching element 160 is disposed in the circuit of the external magnetic-field disturbance compensation coils 120 and the input side 161 of the switching element 160 is connected to an external power supply. The output side (operation side) 162 thereof is opened by applying a current from the external power supply while exciting or degaussing the main coils 110. Thereby, a current is not induced in the external magnetic-field disturbance compensation coils 120 during the exciting or degaussing of the main coils 110 either. In addition, the application of current from the external power supply may be stopped after a current in the main coils 110 has settled down on completion of the exciting or degaussing.

Furthermore, the external magnetic-field disturbance compensation coils 120 may generate some non-uniform magnetic-field component in the imaging space by a current passing through the disturbance compensation coils 120, in situations other than a quench in the main coils 110 or the exciting/degaussing explained before. If a current that passes through the external magnetic-field disturbance compensation coils 120 is integrated for some reason, the current may generate a non-uniform magnetic-field that cannot be neglected with regard to the function of the MRI apparatus. Hence, by providing the coils with the switching element 160, an induced current generated in the external magnetic-field disturbance compensation coils 120 is arbitrarily shut off to zero when needed, that is, the external magnetic-field disturbance compensation coils 120 can be reset.

What is claimed is:

1. A superconducting magnet, comprising:
   a first circuit into which a main coil is connected;
   a second circuit into which an external magnetic-field disturbance compensation coil is connected; and
   a switching element an input side of which is connected to said first circuit in parallel to the main coil, and an output side of which is connected to said second circuit in series to the external magnetic-field disturbance compensation coil, for closing the output side if the voltage on the input side is smaller than a predetermined value, and for opening the output side if the voltage on the input side is larger than the predetermined value.

2. The superconducting magnet according to claim 1, wherein a load resistor is connected in series to the input side of said switching element.

3. The superconducting magnet according to claim 1, wherein a plurality of switching elements, are provided with their output sides being connected in parallel with each other, and being connected in series to the external magnetic-field disturbance compensation coil.

4. The superconducting magnet according to claim 1, wherein said switching element is enclosed by a magnetic shield made of a ferromagnetic material.

5. A magnetic resonance imaging apparatus, comprising:
   the superconducting magnet according to claim 1;
   a refrigeration container for housing said superconducting magnet;
   a vacuum insulating container for housing said refrigeration container;
   a radio frequency reception coil and a radio frequency transmission coil disposed along the periphery of the static magnetic-field generated by said superconducting magnet;
   a gradient magnetic-field coil disposed along the periphery of the static magnetic-field generated by said superconducting magnet; and
   a controller for supplying power to and controlling said radio frequency reception coil, said radio frequency transmission coil, and said gradient magnetic-field coil.

6. A magnetic resonance imaging apparatus, comprising:
   the superconducting magnet according to claim 2;
   a refrigeration container for housing said superconducting magnet;
   a vacuum insulating container for housing said refrigeration container;

a radio frequency reception coil and a radio frequency transmission coil disposed along the periphery of the static magnetic-field generated by said superconducting magnet;

a gradient magnetic-field coil disposed along the periphery of the static magnetic-field generated by said superconducting magnet; and a controller for supplying power to and controlling said radio frequency reception coil, said radio frequency transmission coil, and said gradient magnetic-field coil.

7. A magnetic resonance imaging apparatus, comprising:

the superconducting magnet according to claim 3;

a refrigeration container for housing said superconducting magnet;

a vacuum insulating container for housing said refrigeration container;

a radio frequency reception coil and a radio frequency transmission coil disposed along the periphery of the static magnetic-field generated by said superconducting magnet;

a gradient magnetic-field coil disposed along the periphery of the static magnetic-field generated by said superconducting magnet; and a controller for supplying power to and controlling said radio frequency reception coil, said radio frequency transmission coil, and said gradient magnetic-field coil.

8. A magnetic resonance imaging apparatus, comprising:

the superconducting magnet according to claim 4;

a refrigeration container for housing said superconducting magnet;

a vacuum insulating container for housing said refrigeration container;

a radio frequency reception coil and a radio frequency transmission coil disposed along the periphery of the static magnetic-field generated by said superconducting magnet;

a gradient magnetic-field coil disposed along the periphery of the static magnetic-field generated by said superconducting magnet; and a controller for supplying power to and controlling said radio frequency reception coil, said radio frequency transmission coil, and said gradient magnetic-field coil.

* * * * *